US010180476B2

(12) United States Patent
Cohen

(10) Patent No.: US 10,180,476 B2
(45) Date of Patent: Jan. 15, 2019

(54) SYSTEMS AND METHODS FOR SEGMENTED MAGNETIC RESONANCE FINGERPRINTING DICTIONARY MATCHING

(71) Applicant: The General Hospital Corporation, Boston, MA (US)

(72) Inventor: Ouri Cohen, Teaneck, NJ (US)

(73) Assignee: The General Hospital Corporation, Boston, MA (US)

(*) Notice: Subject to any disclaimer, the term of this patent is extended or adjusted under 35 U.S.C. 154(b) by 151 days.

(21) Appl. No.: 15/294,977

(22) Filed: Oct. 17, 2016

(65) Prior Publication Data

US 2017/0146623 A1 May 25, 2017

Related U.S. Application Data

(60) Provisional application No. 62/259,787, filed on Nov. 25, 2015.

(51) Int. Cl.
*G01R 33/50* (2006.01)
*G01R 33/48* (2006.01)
*G01R 33/56* (2006.01)

(52) U.S. Cl.
CPC ........ *G01R 33/4828* (2013.01); *G01R 33/50* (2013.01); *G01R 33/5602* (2013.01)

(58) Field of Classification Search
CPC . G01R 33/4828; G01R 33/50; G01R 33/5602
(Continued)

(56) References Cited

U.S. PATENT DOCUMENTS 6,700,374 B1* 3/2004 Wu ................. G01R 33/56554
324/306
7,337,205 B2* 2/2008 Sazegari ............... G06F 17/16
708/607
(Continued)

FOREIGN PATENT DOCUMENTS

EP          3224642 A1 * 10/2017
EP          3224642 A1 * 10/2017 ......... G01R 33/5608
(Continued)

OTHER PUBLICATIONS

Ma et al., Magnetic Resonance Fingerprinting, Nature—vol. 495—Mar. 14, 2013. Copyright Macmillan Publishers Limited.*
(Continued)

*Primary Examiner* — Dixomara Vargas
*Assistant Examiner* — Sean Curtis
(74) *Attorney, Agent, or Firm* — Quarles & Brady LLP

(57) ABSTRACT

Systems and methods for producing a quantitative parameter map using a magnetic resonance imaging (MRI) system includes providing magnetic resonance fingerprinting (MRF) data acquired with an MRI system from a subject. The MRF data represents a plurality of different signal evolutions acquired using different acquisition parameter settings. The method also includes providing a database comprising a plurality of sub-dictionaries, each sub-dictionary including a plurality of signal templates, sequentially comparing the MRF data to each of the sub-dictionaries to estimate quantitative parameters, and generating a quantitative parameter map of the subject using the estimate quantitative parameters.

12 Claims, 3 Drawing Sheets

(58) Field of Classification Search
USPC .................................................. 324/300–322
See application file for complete search history.

(56) References Cited

U.S. PATENT DOCUMENTS

| | | | | |
|---|---|---|---|---|
| 7,772,844 | B2* | 8/2010 | Hurd | A61B 5/055 |
| | | | | 324/309 |
| 7,945,305 | B2* | 5/2011 | Aggarwal | G01R 33/5673 |
| | | | | 600/407 |
| 8,558,546 | B2* | 10/2013 | Griswold | G01R 33/50 |
| | | | | 324/309 |
| 8,723,518 | B2* | 5/2014 | Seiberlich | G01R 33/543 |
| | | | | 324/307 |
| 9,897,675 | B2* | 2/2018 | Setsompop | G01R 33/4828 |
| 9,958,521 | B2* | 5/2018 | Kaditz | G01R 33/48 |
| 2012/0235678 | A1* | 9/2012 | Seiberlich | G01R 33/56 |
| | | | | 324/307 |
| 2013/0265047 | A1* | 10/2013 | Griswold | G01R 33/56 |
| | | | | 324/309 |
| 2014/0103924 | A1* | 4/2014 | Griswold | G01R 33/3635 |
| | | | | 324/309 |
| 2014/0167754 | A1* | 6/2014 | Jerecic | G01R 33/561 |
| | | | | 324/309 |
| 2015/0070012 | A1* | 3/2015 | Griswold | G01R 33/283 |
| | | | | 324/309 |
| 2015/0301138 | A1* | 10/2015 | Griswold | G01R 33/56563 |
| | | | | 324/309 |
| 2015/0346301 | A1* | 12/2015 | Cauley | G01R 33/4828 |
| | | | | 324/309 |
| 2016/0116559 | A1* | 4/2016 | Cohen | G01R 33/561 |
| | | | | 324/309 |
| 2016/0291107 | A1* | 10/2016 | Rosen | G01R 33/543 |
| 2016/0299206 | A1* | 10/2016 | Cohen | G01R 33/50 |
| 2016/0349339 | A1* | 12/2016 | Brady-Kalnay | G01R 33/50 |
| 2016/0349341 | A1* | 12/2016 | Cohen | A61B 5/055 |
| 2016/0349342 | A1* | 12/2016 | Cohen | G01R 33/543 |
| 2017/0007148 | A1* | 1/2017 | Kaditz | A61B 5/055 |
| 2017/0011255 | A1* | 1/2017 | Kaditz | G01R 33/48 |
| 2017/0139025 | A1* | 5/2017 | Cohen | G01R 33/4818 |
| 2017/0146623 | A1* | 5/2017 | Cohen | G01R 33/4828 |
| 2017/0276753 | A1* | 9/2017 | Cohen | G01R 33/50 |
| 2017/0285122 | A1* | 10/2017 | Kaditz | G01R 33/445 |
| 2017/0285123 | A1* | 10/2017 | Kaditz | G01R 33/5608 |
| 2017/0299683 | A1* | 10/2017 | Cohen | G01R 33/56366 |
| 2017/0319098 | A1* | 11/2017 | Wang | A61B 5/055 |
| 2017/0328973 | A1* | 11/2017 | Amthor | G01R 33/5608 |
| 2017/0371015 | A1* | 12/2017 | Irfanullah | G01R 33/4828 |
| 2018/0017646 | A1* | 1/2018 | Feiweier | G01R 33/561 |
| 2018/0031667 | A1* | 2/2018 | Sarracanie | G01R 33/5659 |
| 2018/0238983 | A1* | 8/2018 | Cohen | G01R 33/543 |

FOREIGN PATENT DOCUMENTS

| | | | | |
|---|---|---|---|---|
| WO | WO 2016160121 A1 * | 10/2016 | ............. | G01R 33/50 |
| WO | WO-2016160121 A1 * | 10/2016 | ............. | G01R 33/50 |

OTHER PUBLICATIONS

Hamilton et al., MR Fingerprinting for Rapid Quanitification of Myocardial T1, T2, and Proton Spin Density; Magnetic Resonance in Medicine. Copyright 2016 International Society for Magnetic Resonance in Medicine.*

Hoppe et al., Deep Learning for Magnetic Resonance Fingerprinting: A New Approach for Predicting Quantitative Parameter Values from Time Series; Copyright 2017 German Association for Medical Informatics, Biometry and Epidemiology e.V. and IOS Press.*

Mlynarik, V., Magnetic Resonance Fingerprinting—Principles and First Clinical Results, Measurement 2017—Proceeedings of the 11$^{th}$ International Conference, Smolenice, Slovakia.*

Zhan et al., Fast Multi-Class Dictionaries Learning with Geometrical Directions in MRI Reconstruction. IEEE Transactions on Biomedical Engineering. vol. 63, No. 9. Sep. 2016.*

Coppo et al., Overview of Magnetic Resonance Fingerprinting, MAGNETOM Flash, www.siemens.com/magnetom-world. Feb. 2016. (Year: 2016).*

PCT/US2015/011948—International Preliminary Report on Patentability—of U.S. Appl. No. 15/116,999. dated Oct. 2015. (Year: 2015).*

Ma et al., Magnetic Resonance Fingerprinting, Nature—vol. 495— Mar. 14, 2013. Copyright Macmillan Publishers Limited. (Year: 2013).*

Hamilton et al., MR Fingerprinting for Rapid Quanitification of Myocardial T1, T2, and Proton Spin Density; Magnetic Resonance in Medicine. Copyright 2016 International Society for Magnetic Resonance in Medicine. (Year: 2016).*

Hoppe et al., Deep Learning for Magnetic Resonance Fingerprinting: A New Approach for Predicting Quantitative Parameter Values from Time Series; Copyright 2017 German Association for Medical Informatics, Biometry and Epidemiology e.V. and IOS Press (Year: 2017).*

Mlynarik, V., Magnetic Resonance Fingerprinting—Principles and First Clinical Results, Measurement 2017—Proceeedings of the 11th International Conference, Smolenice, Slovakia. (Year: 2017).*

Zhan et al., Fast Multi-Class Dictionaries Learning with Geometrical Directions in MRI Reconstruction. IEEE Transactions on Biomedical Engineering. vol. 63, No. 9. Sep. 2016. (Year: 2016).*

Chen et al., MR Fingerprinting for Rapid Quantitative Abdominal Imaging. Radiology: vol. 279—No. 1. (Year: 2016).*

Cauley, et al., Fast Group Matching for MR Fingerprinting Reconstruction, Magnetic Resonance in Medicine, 2015, 74:523-528.

* cited by examiner

SYSTEMS AND METHODS FOR SEGMENTED MAGNETIC RESONANCE FINGERPRINTING DICTIONARY MATCHING

CROSS-REFERENCE TO RELATED APPLICATIONS

This application is based on, claims priority to, and incorporates herein by reference, U.S. Provisional Application Ser. No. 62/259,787, filed, Nov. 25, 2015, and entitled, "SYSTEM AND METHOD FOR SEGMENTED MAGNETIC RESONANCE FINGERPRINTING MATCHING."

STATEMENT REGARDING FEDERALLY SPONSORED RESEARCH

N/A

BACKGROUND

The present disclosure relates generally to systems and methods for magnetic resonance imaging ("MRI"). More particularly, the present disclosure relates to systems and methods for producing quantitative parameter maps using magnetic resonance fingerprinting ("MRF").

MRF is an imaging technique that enables quantitative mapping of tissue or other material properties based on random or pseudorandom measurements of the subject or object being imaged. Examples of parameters that can be mapped include longitudinal relaxation time, $T_1$; transverse relaxation time, $T_2$; main magnetic field map, $B_0$; and proton density, $\rho$. MRF is generally described in U.S. Pat. No. 8,723,518, which is herein incorporated by reference in its entirety.

The random or pseudorandom measurements obtained in MRF techniques are achieved by varying the acquisition parameters from one repetition time ("TR") period to the next, which creates a time series of images with varying contrast. Examples of acquisition parameters that can be varied include flip angle, radio frequency ("RF") pulse phase, TR, echo time ("TE"), and sampling patterns, such as by modifying one or more readout encoding gradients.

MR Fingerprinting requires matching an acquired magnetization signal to a pre-computed dictionary. More particularly, the data acquired with MRF techniques are compared with a dictionary of signal models, or templates, that have been generated for different acquisition parameters from magnetic resonance signal models, such as Bloch equation-based physics simulations. This comparison allows estimation of the desired physical parameters, such as those mentioned above. The parameters for the tissue or other material in a given voxel are estimated to be the values that provide the best signal template matching.

To be effective, the dictionary must adequately cover the range of tissue parameters and values to obtain an accurate matching. However, the dictionary size needed rapidly increases with the number of tissue maps desired. The larger dictionaries require significant memory, storage, and processing time. Some, such as Cauley, Stephen F., et al. "Fast group matching for MR fingerprinting reconstruction." *Magnetic Resonance in Medicine* (2014), have attempted to address this issue by pre-grouping the dictionary entries and using the singular value decomposition (SVD) to truncate the matrix. Unfortunately, for large dictionaries, the grouping and SVD may themselves be resource intensive. Additionally, the truncation applied in this process risks eliminating signals needed for accurate matching.

Therefore, a need persists for a fast matching method that does not truncate any dictionary entries or require significant computational resources.

SUMMARY

The present disclosure overcomes the aforementioned drawbacks by providing systems and methods for creating and using sub-dictionaries that increases the efficiency and reduces the time required to create quantitative parameter maps from MRF data. That is, systems and processes are provided that facilitate matching to arbitrarily sized dictionaries despite limited memory or computational resources and, thereby, increase the efficiency and decrease the computational time and resources needed to create MRF quantitative parameter maps.

In accordance with one aspect of the disclosure, a method is provided for producing a quantitative parameter map using a magnetic resonance imaging (MRI) system. The method includes providing magnetic resonance fingerprinting (MRF) data acquired with an MRI system from a subject. The MRF data represents a plurality of different signal evolutions acquired using different acquisition parameter settings. The method also includes providing a database comprising a plurality of sub-dictionaries, each sub-dictionary including a plurality of signal templates, sequentially comparing the MRF data to each of the sub-dictionaries to estimate quantitative parameters, and generating a quantitative parameter map of the subject using the estimate quantitative parameters.

In accordance with another aspect of the disclosure, a system is provided for producing a quantitative parameter map using a magnetic resonance imaging (MRI) system. The system includes a processor and a non-transitory memory having stored thereon a database of sub-dictionaries, each including a plurality of signal templates. The memory also includes a computer program that, when executed by a processor causes the processor to access magnetic resonance fingerprinting (MRF) data acquired from a subject, wherein the MRF data represents a plurality of different signal evolutions acquired using different acquisition parameter settings. The processor is also caused to access the database of sub-dictionaries, sequentially compare the MRF data to each of the sub-dictionaries to estimate quantitative parameters, and generate a quantitative parameter map of the subject using the estimate quantitative parameters. The system also includes a display configured to display the quantitative parameter map.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION

Figure 1:
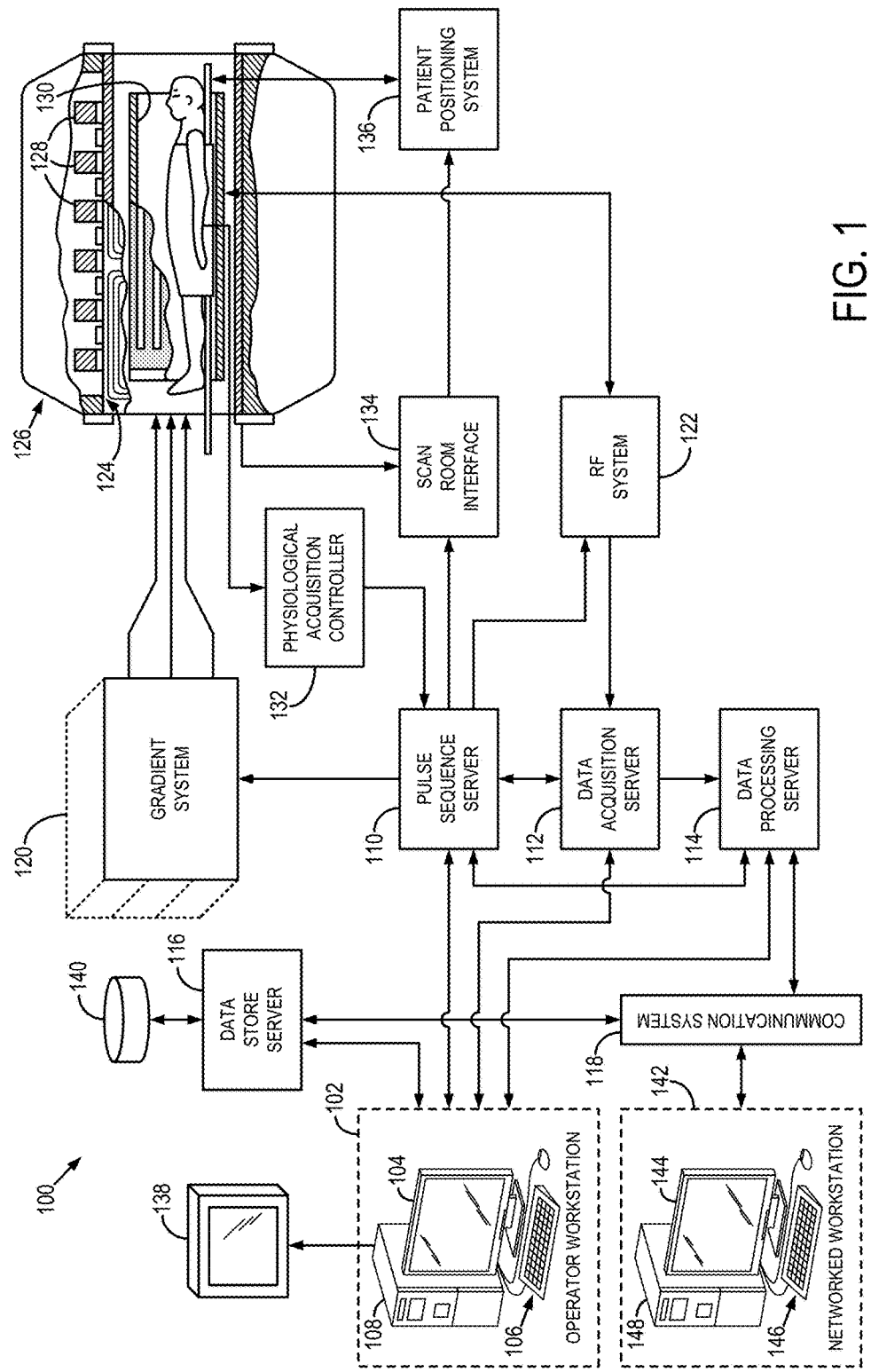
FIG. 1 is a block diagram of an example of a magnetic resonance imaging ("MRI") system for use in accordance with the present disclosure.

Referring to FIG. 1, an example of a magnetic resonance imaging ("MRI") system 100 is illustrated. The MRI system 100 includes an operator workstation 102, which will typically include a display 104; one or more input devices 106, such as a keyboard and mouse; and a processor 108. The processor 108 may include a commercially available programmable machine running a commercially available operating system. The operator workstation 102 provides the operator interface that enables scan prescriptions to be entered into the MRI system 100. In general, the operator workstation 102 may be coupled to four servers: a pulse sequence server 110; a data acquisition server 112; a data processing server 114; and a data store server 116. The operator workstation 102 and each server 110, 112, 114, and 116 are connected to communicate with each other. For example, the servers 110, 112, 114, and 116 may be connected via a communication system 118, which may include any suitable network connection, whether wired, wireless, or a combination of both. As an example, the communication system 118 may include both proprietary or dedicated networks, as well as open networks, such as the internet.

The pulse sequence server 110 functions in response to instructions downloaded from the operator workstation 102 to operate a gradient system 120 and a radiofrequency ("RF") system 122. Gradient waveforms necessary to perform the prescribed scan are produced and applied to the gradient system 120, which excites gradient coils in an assembly 124 to produce the magnetic field gradients $G_x$, $G_y$, and $G_z$ used for position encoding magnetic resonance signals. The gradient coil assembly 124 forms part of a magnet assembly 126 that includes a polarizing magnet 128 and a whole-body RF coil 130 or local RF coil.

In operation, RF waveforms are applied by the RF system 122 to the RF coil 130, or a separate local coil, in order to perform the prescribed magnetic resonance pulse sequence. Responsive magnetic resonance signals detected by the RF coil 130, or a separate local coil, are received by the RF system 122, where they are amplified, demodulated, filtered, and digitized under direction of commands produced by the pulse sequence server 110. The RF system 122 includes an RF transmitter for producing a wide variety of RF pulses used in MRI pulse sequences. The RF transmitter is responsive to the scan prescription and direction from the pulse sequence server 110 to produce RF pulses of the desired frequency, phase, and pulse amplitude waveform. The generated RF pulses may be applied to the whole-body RF coil 130 or to one or more local coils or coil arrays (not shown in FIG. 5).

The RF system 122 also includes one or more RF receiver channels. Each RF receiver channel includes an RF preamplifier that amplifies the magnetic resonance signal received by the coil 130 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \qquad (1);$$

and the phase of the received magnetic resonance signal may also be determined according to the following relationship:

$$\varphi = \tan^{-1}\left(\frac{Q}{I}\right). \qquad (2)$$

The pulse sequence server 110 also optionally receives patient data from a physiological acquisition controller 132. By way of example, the physiological acquisition controller 132 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 134 that receives signals from various sensors associated with the condition of the patient and the magnet system. It is also through the scan room interface circuit 134 that a patient positioning system 136 receives commands to move the patient to desired positions during the scan.

The digitized magnetic resonance signal samples produced by the RF system 122 are received by the data acquisition server 112. The data acquisition server 112 operates in response to instructions downloaded from the operator workstation 102 to receive the real-time magnetic resonance data and provide buffer storage, such that no data is lost by data overrun. In some scans, the data acquisition server 112 does little more than pass the acquired magnetic resonance data to the data processor server 114. However, in scans that require information derived from acquired magnetic resonance data to control the further performance of the scan, the data acquisition server 112 is programmed to produce such information and convey it to the pulse sequence server 110. For example, during prescans, magnetic resonance data is acquired and used to calibrate the pulse sequence performed by the pulse sequence server 110. As another example, navigator signals may be acquired and used to adjust the operating parameters of the RF system 122 or the gradient system 120, or to control the view order in which k-space is sampled. In still another example, the data acquisition server 112 may also be employed to process magnetic resonance signals used to detect the arrival of a contrast agent in a magnetic resonance angiography ("MRA") scan. By way of example, the data acquisition server 112 acquires magnetic resonance data and processes it in real-time to produce information that is used to control the scan.

The data processing server 114 receives magnetic resonance data from the data acquisition server 112 and processes it in accordance with instructions downloaded from the operator workstation 102. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 114 are conveyed back to the operator workstation 102 where they are stored. Real-time images are stored in a data base memory cache (not shown in FIG. 1), from which they may be output to operator display 104 or a display 138 that is located near the magnet assembly 126 for use by attending physicians. Batch mode images or selected real time images are stored in a host database on disc storage 140. When such images have been reconstructed and transferred to storage, the data processing server 114 notifies the data store server 116 on the operator workstation 102. The operator workstation 102 may be used by an operator to archive the images, produce films, or send the images via a network to other facilities.

The MRI system 100 may also include one or more networked workstations 142. By way of example, a networked workstation 142 may include a display 144; one or more input devices 146, such as a keyboard and mouse; and a processor 148. The networked workstation 142 may be located within the same facility as the operator workstation 102, or in a different facility, such as a different healthcare institution or clinic.

The networked workstation 142, whether within the same facility or in a different facility as the operator workstation 102, may gain remote access to the data processing server 114 or data store server 116 via the communication system 118. Accordingly, multiple networked workstations 142 may have access to the data processing server 114 and the data store server 116. In this manner, magnetic resonance data, reconstructed images, or other data may be exchanged between the data processing server 114 or the data store server 116 and the networked workstations 142, such that the data or images may be remotely processed by a networked workstation 142. This data may be exchanged in any suitable format, such as in accordance with the transmission control protocol ("TCP"), the internet protocol ("IP"), or other known or suitable protocols.

Figure 2:
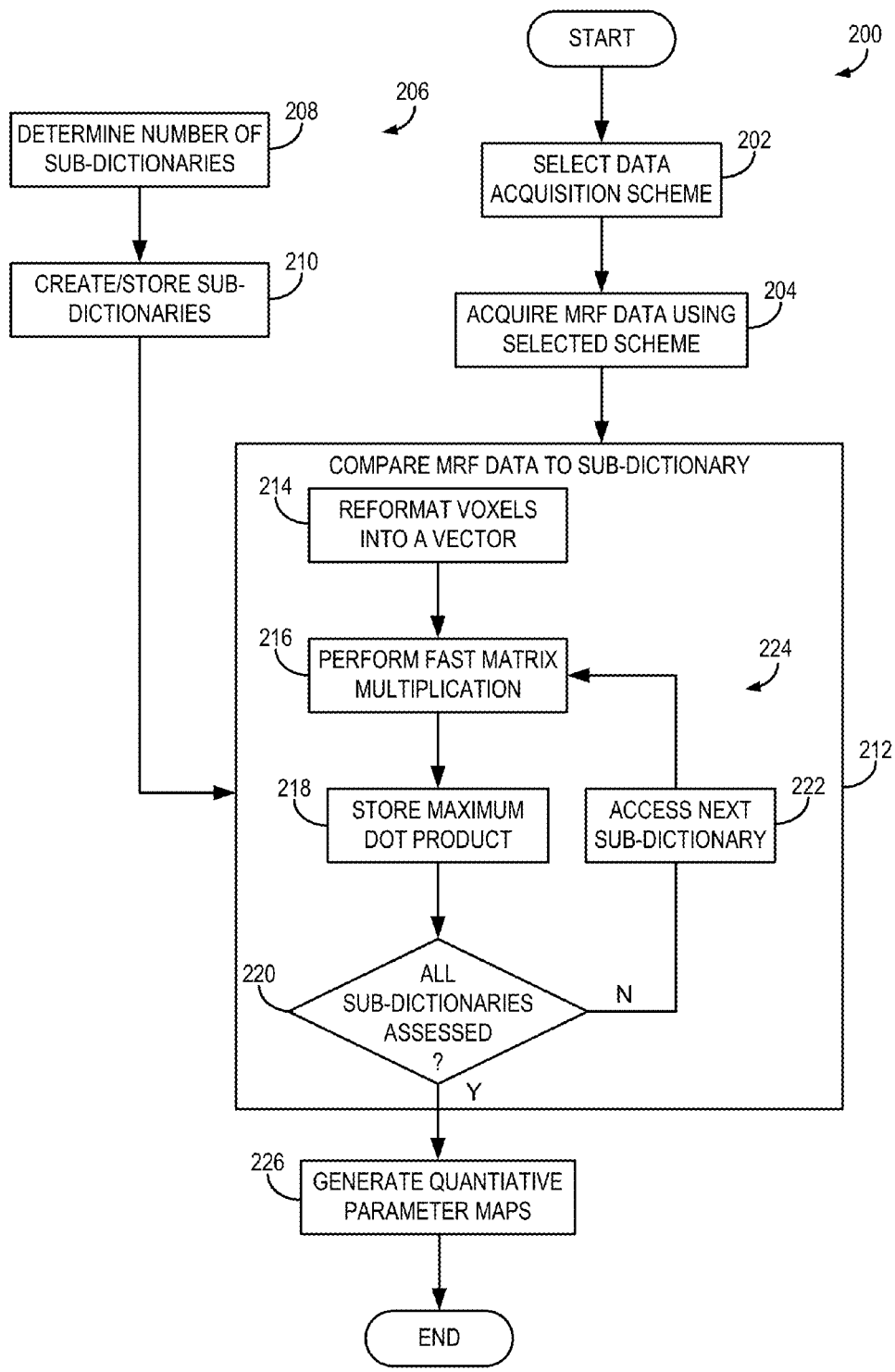
FIG. 2 is a flow chart setting forth steps of a method in accordance with the present disclosure and for use with a system, such as illustrated in FIG. 1.

Referring to FIG. 2, the above-described MRI system 100 can be used to perform a magnetic resonance fingerprinting ("MRF") process. For example, an MRF process 200, at process block 202, begins by selecting a data acquisition scheme that causes signals from different materials or tissues to be spatially and temporally incoherent by continuously varying acquisition parameters throughout the data acquisition process. Examples of acquisition parameters that can be varied include flip angle, radio frequency ("RF") pulse phase, repetition time ("TR"), echo time ("TE"), and sampling patterns, such as by modifying readout encoding gradients. The acquisition parameters are varied, such as in a random or in a pseudorandom manner.

At process block 204, MRF data is acquired using the acquisition scheme or parameters selected at process block 202. As a result of the spatial and temporal incoherence imparted by the this acquisition scheme, each material or tissue is associated with a unique signal evolution or "fingerprint," that is a function of multiple different physical parameters, including longitudinal relaxation time, $T_1$; transverse relaxation time, $T_2$; main magnetic field map, $B_0$; and proton density, $\rho$.

Quantitative parameter maps can be generated from the signals acquired at process block 204, based on a comparison of the signals to a dictionary of many predicted signal evolutions. Traditionally, the dictionary includes entries associated with different combinations of material, environmental, and acquisition parameters. Thus, the comparison of acquired MRF data with the dictionary results in the selection of a signal vector, which may constitute a weighted combination of signal vectors, from the dictionary that best correspond to the observed signal evolution. The selected signal vector includes values for multiple different quantitative parameters, which can be extracted from the selected signal vector and used to generate the relevant quantitative parameter maps.

As such, in a traditional MRF process, the step of comparing the MRF signals to a dictionary can be very cumbersome and require an extended period of time to assess all of the predicted signal evolutions in the dictionary. However, in accordance with the present disclosure, instead of matching the signal from each voxel to the entire (large) dictionary, the dictionary is divided into multiple, smaller, sub-dictionaries that are used to match the data sequentially. This permits fast matching to dictionaries of arbitrary size, despite limited memory and computational resources.

In particular, a process 206 of creating segmented MRF dictionaries in accordance with the present disclosure is provided. At process block 208, the number of sub-dictionaries to be created is determined. For example, the number of entries in each sub-dictionary may be determined based on a user selection and/or can be set based on the available amount of memory or processor cores available on the computer system being used to perform the matching process. At process block 210, each sub-dictionary is created and stored on a disk as it is generated, limiting the amount of memory needed.

After all sub-dictionaries have been created and stored, the data acquired at process block 204 is compared to the sub-dictionaries at process block 212. Rather than match each voxel individually, the voxels may be reformatted into a vector at process block 214. As such, matching can be formulated as a fast matrix multiplication against a given sub-dictionary at process block 216. At process block 218, the maximum dot product for the given sub-dictionary for each voxel is stored. At decision block 220, if not all sub-dictionaries have been assessed, the next sub-dictionary is accessed at process block 222 and the data is then processed against the next sub-dictionary until, at decision block 220, all sub-dictionaries have been accessed. When iterating through loop 224, for a given voxel, if the maximum dot product for the next sub-dictionary is higher (indicating a better match) than the previous value stored at process block 218, the previous value may be discarded and the new one stored. If not, the previous maximum dot product form the prior sub-dictionary remains the overall maximum value that that has been found and that previous value is kept. This process 224 iterates until all sub-dictionaries have been used. Since each sub-dictionary is limited in size, processing time is fixed and fast. Once the acquired MRF signals have been compared to the sub-dictionaries of the many predicted signal evolutions to determine the best match, quantitative parameter maps of the subject can be generated at process block 226.

The above-described process 206 for creating and using sub-dictionaries can be realized in any of a variety of implementations. In one non-limiting example, the process for creating sub-dictionaries may be realized in pseudo-code as follows:

|   |   | Comment |
|---|---|---|
| 1 | Let N = size of total dictionary | |
| 2 | Let M = size of each sub-dictionary | M can be set to any value but a good rule of thumb is to pick a size that is within |

-continued

| | | Comment |
|---|---|---|
| | | the memory and processing power of the system, say, 50,000 or 100,000. The exact number is flexible and can be tailored to the system. |
| 3 | Let currentDictCounter = 0 | |
| 4 | Let currentDictEntriesCounter =0 | |
| 5 | For 1 to N | loop over the entries in the total dictionary |
| 6 | If (currentDictEntriesCounter < M) | if the current counter is smaller than the sub-dictionary size |
| 7 | Generate magnetization trajectory for current tissue parameter value | |
| 8 | Add the magnetization to the current sub-dictionary | |
| 9 | Increment currentDictEntriesCounter | |
| 10 | Else | If the number of entries generated is greater than the M defined by the user |
| 11 | Write the sub-dictionary to file | |
| 12 | Reset currentDictEntriesCounter | |
| 13 | Increment currentDictCounter | |
| 14 | Loop | |

As a further non-limiting example, the above-described process 212 for matching against the sub-dictionaries can be realized in pseudo-code as follows:

| | |
|---|---|
| 1 | Set initial dot product to 0 for all voxels |
| 2 | For 1 to Total number of sub-dictionaries |
| 3 | Match voxels to current sub-dictionary |
| 4 | If current dot product > stored dot product |
| 5 | Extract the corresponding tissue parameters |
| 6 | Store the new dot product |
| 7 | Else |
| 8 | Ignore |
| 9 | Loop |

Figure 3:
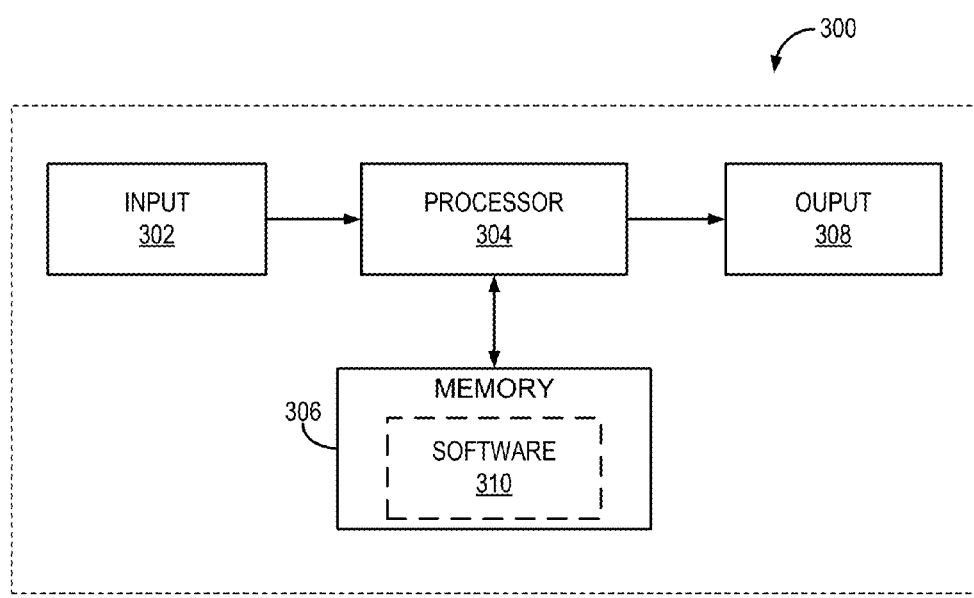
FIG. 3 is a block diagram of a system for use in creating MRF quantitative parameter maps in accordance with the present disclosure.

Referring now to FIG. 3, a block diagram of an example computer system 300 that can be used for producing and/or assessing sub-dictionaries and/or for implementing a fast matching algorithm in accordance with some configurations of the present disclosure is illustrated. The system 300 may be part of the system 100 described above with respect to FIG. 1 or may be a separate system. The system 300 may include an input 302, at least one processor 304, a memory 306, and an output 308. The system 300 may be, for example, a workstation, a notebook computer, a portable tablet, a personal digital assistant ("PDA"), a multimedia device, a smartphone, a network server, a mainframe, or any other general-purpose or application-specific computing device. In some configurations, the computer system 300 may form a part of a MRI system of FIG. 1. The computer system 300 may operate autonomously or semi-autonomously, or may read executable software instructions from a computer-readable medium (such as a hard drive, a CD-ROM, flash memory, and the like), or may receive instructions from a user, or any another source logically connected to a computer or device, such as another networked computer or server, via the input 302.

The input 302 may take a variety of shapes or forms, as desired, for operation of the computer system 300, including the ability for selecting, entering, or otherwise specifying parameters consistent with operating the computer system 300. In some instances, the input 302 may be designed to receive data acquired with the MRI system 100 of FIG. 1, which may be in the form of reconstructed images or raw k-space data.

Among the processing tasks for operating the computer system 300, the at least one processor 304 may be configured to perform the methods described above with respect to FIG. 2. To this end, the memory 306 may contain software 310, and may be configured for storage and retrieval of processed information and data to be processed by the processor 304. In some aspects, the software 310 may contain instructions directed to performing the methods described above with respect to FIG. 2.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing a quantitative parameter map using a magnetic resonance imaging (MRI) system, the steps of the method comprising:
   (a) providing magnetic resonance fingerprinting (MRF) data acquired with an MRI system from a subject, wherein the MRF data represents a plurality of different signal evolutions acquired using different acquisition parameter settings;
   (b) providing a database comprising a plurality of sub-dictionaries, each sub-dictionary including a plurality of signal templates;
   (c) sequentially comparing the MRF data to each of the sub-dictionaries to estimate quantitative parameters by converting each voxel of the MRF data to vectors, and comparing a first vector created for a given voxel based on a preceding sub-dictionary to a second vector created for the given voxel based on a current sub-dictionary to determine a maximum dot product created form across the sub-dictionaries; and
   (d) generating a quantitative parameter map of the subject using the estimate quantitative parameters created from the maximum dot product created form across the sub-dictionaries.

2. The method of claim 1 wherein step (c) further includes converting each voxel of the MRF data to vectors to determine a maximum dot product with each of the sub-dictionaries.

3. The method of claim 2 wherein step (c) further includes sequentially performing a matrix multiplication of the vectors by each sub-dictionary and storing the maximum dot product of the matrix multiplication across all of the sub-dictionaries.

4. The method of claim 3 further comprising selecting entries of a sub-dictionary corresponding to the maximum dot product to estimate the quantitative parameters.

5. The method of claim 1 further comprising creating the sub-dictionaries based on one of a user constraint or a computer system constraint.

6. A system for producing a quantitative parameter map using a magnetic resonance imaging (MRI) system, the system comprising:
   a processor;
   a non-transitory memory having stored thereon a database of sub-dictionaries formed by dividing a total dictionary into each sub-dictionary by looping over the total dictionary to select dictionary entries in the total dictionary that, together, are less than a predetermined size, each including a plurality of signal templates and a computer program that, when executed by a processor causes the processor to:
 access magnetic resonance fingerprinting (MRF) data acquired from a subject, wherein the MRF data represents a plurality of different signal evolutions acquired using different acquisition parameter settings;
 access the database of sub-dictionaries;
 sequentially compare the MRF data to each of the sub-dictionaries to estimate quantitative parameters;
 generate a quantitative parameter map of the subject using the estimate quantitative parameters; and
 a display configured to display the quantitative parameter map.

7. The system of claim 6 wherein the processor is further caused to convert each voxel of the MRF data to vectors to determine a maximum dot product with each of the sub-dictionaries.

8. The system of claim 7 wherein the processor is further caused to sequentially perform a matrix multiplication of the vectors by each sub-dictionary and store the maximum dot product of the matrix multiplication across all of the sub-dictionaries in the non-transitory memory.

9. The system of claim 8 wherein the processor is further caused to select entries of a sub-dictionary corresponding to the maximum dot product to estimate the quantitative parameters.

10. The system of claim 6 wherein the processor is further caused to receive one of a user selection and a resource constraint and create the sub-dictionaries based on one of the user selection or the resource constraint.

11. The system of claim 6 wherein the processor and the non-transitory memory for part of a magnetic resonance imaging (MRI) system.

12. The system of claim 6 wherein the different acquisition parameter settings are selected using one of random or pseudorandom acquisition parameters.

\* \* \* \* \*